US009627348B2

(12) United States Patent
Ryu et al.

(10) Patent No.: US 9,627,348 B2
(45) Date of Patent: Apr. 18, 2017

(54) LASER ASSISTED BONDING FOR SEMICONDUCTOR DIE INTERCONNECTIONS

(71) Applicant: Amkor Technology, Inc., Chandler, AZ (US)

(72) Inventors: Dong Su Ryu, Gyeonggi-do (KR); Choon Heung Lee, Seoul (KR); Min Ho Kim, Seoul (KR); Choong Hoe Kim, Seoul (KR); Ju Hoon Yoon, Gyeonggi-do (KR); Chan Ha Hwang, Gyeonggi-do (KR); Yang Gyoo Jung, Seoul (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 18 days.

(21) Appl. No.: 14/592,571

(22) Filed: Jan. 8, 2015

(65) Prior Publication Data
US 2016/0049381 A1    Feb. 18, 2016

(30) Foreign Application Priority Data
Aug. 14, 2014  (KR) .................. 10-2014-0105848

(51) Int. Cl.
*H01L 23/00*    (2006.01)
*H05K 3/34*    (2006.01)
(52) U.S. Cl.
CPC ............ *H01L 24/81* (2013.01); *H05K 3/3494* (2013.01); *H01L 2224/81201* (2013.01);
(Continued)

(58) Field of Classification Search
CPC ............ H01L 24/81; H01L 2224/81201; H01L 2224/81224; H01L 2224/82815; H01K 3/3436
See application file for complete search history.

(56) References Cited

U.S. PATENT DOCUMENTS 4,826,736 A * 5/1989 Nakamura ............. B23K 20/04
148/525
4,893,742 A * 1/1990 Bullock ................. B23K 20/10
219/121.63
(Continued)

FOREIGN PATENT DOCUMENTS

JP    2003-258037    * 12/2003    ............ H01L 21/60

*Primary Examiner* — Charles Garber
*Assistant Examiner* — Brigitte Paterson
(74) *Attorney, Agent, or Firm* — McAndrews, Held & Malloy, Ltd.

(57) ABSTRACT

Laser assisted bonding for semiconductor die interconnections is disclosed and may, for example, include forming flux on a circuit pattern on a circuit board, placing a semiconductor die on the circuit board where a bump on the semiconductor die contacts the flux, and reflowing the bump by directing a laser beam toward the semiconductor die. The laser beam may volatize the flux and make an electrical connection between the bump and the circuit pattern. A jig plate may be placed on the semiconductor die when the laser beam is directed toward the semiconductor die. Warpage may be reduced during heating or cooling of the semiconductor die by applying pressure to the jig plate. Jig bars may extend outward from the jig plate and may be in contact with the circuit board during the application of pressure to the jig plate. The jig plate may comprise one or more of: silicon, silicon carbide, and glass.

17 Claims, 10 Drawing Sheets

(52) U.S. Cl.
CPC .......... *H01L 2224/81224* (2013.01); *H01L 2224/81815* (2013.01); *H01L 2924/3511* (2013.01); *H05K 3/3436* (2013.01); *H05K 2201/068* (2013.01); *H05K 2201/10674* (2013.01); *H05K 2203/107* (2013.01)

(56) References Cited

U.S. PATENT DOCUMENTS

| | | | |
|---|---|---|---|
| 5,305,944 A * | 4/1994 | Yoshida | B23K 1/0053 228/102 |
| 2006/0060979 A1* | 3/2006 | Frutschy | H01L 24/81 257/772 |
| 2010/0326702 A1* | 12/2010 | Dang | H01L 21/6835 174/250 |
| 2013/0256854 A1* | 10/2013 | Kobayashi | H01L 23/49568 257/675 |
| 2013/0270230 A1* | 10/2013 | Cheung | H01L 24/75 219/121.6 |
| 2013/0312460 A1* | 11/2013 | Kunishi | B28D 5/0011 65/112 |
| 2014/0193952 A1* | 7/2014 | Lin | H01L 24/81 438/108 |
| 2014/0273289 A1* | 9/2014 | Omura | H01L 33/0095 438/4 |

* cited by examiner

LASER ASSISTED BONDING FOR SEMICONDUCTOR DIE INTERCONNECTIONS

CROSS-REFERENCE TO RELATED APPLICATIONS

The present application makes reference to, claims priority to, and claims the benefit of Korean Patent Application No. 10-2014-0105848, filed on Aug. 14, 2014, the contents of which are hereby incorporated herein by reference, in their entirety.

FIELD

Certain embodiments of the disclosure relate to semiconductor chip packaging. More specifically, certain embodiments of the disclosure relate to laser assisted bonding for semiconductor die interconnections.

BACKGROUND

In general, a semiconductor package includes a semiconductor die, a plurality of leads electrically connected to the semiconductor die and an encapsulant encapsulating the semiconductor die and the leads.

A method for bonding a semiconductor die (e.g., in a flip chip configuration) and a circuit board using bumps generally includes providing a semiconductor die and a circuit board, jetting flux onto the circuit board, die-attaching for aligning bumps of the semiconductor die on the flux, reflowing the bumps by placing the semiconductor die and the circuit board in an oven and applying a temperature ranging from approximately 240° C. to approximately 260° C. in the furnace, and removing the semiconductor die and the circuit board from the furnace and cooling the bumps.

However, the reflow temperature (ranging from 240° C. to 260° C.) applied to the circuit board in a reflow process may cause extensive thermal expansion in the circuit board and considerable shrinkage may occur to the circuit board in a cooling process, creating cracks in bumps as connecting regions of the semiconductor die and the circuit board, resulting in electrical disconnection between the semiconductor die and the circuit board.

Further limitations and disadvantages of conventional and traditional approaches will become apparent to one of skill in the art, through comparison of such systems with the present disclosure as set forth in the remainder of the present application with reference to the drawings.

BRIEF SUMMARY

Laser assisted bonding for semiconductor die interconnections, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Figure 1A:
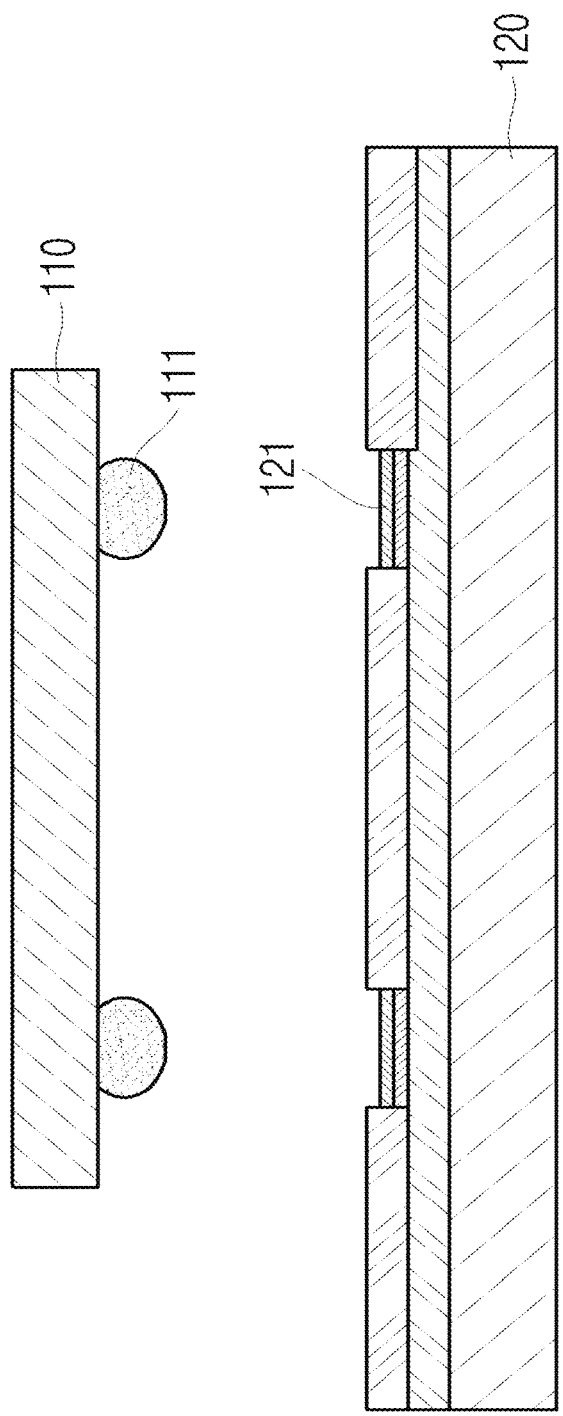
FIGS. 1A to 1D are schematic views of a laser assisted bonding method for semiconductor die interconnection according to an embodiment of the present disclosure, illustrating intermediate process steps on a unit basis.

Certain aspects of the disclosure may be found in a method for laser assisted bonding for semiconductor die interconnections comprising forming flux on a circuit pattern on a circuit board, placing a semiconductor die on the circuit board where a bump on the semiconductor die contacts the flux, and reflowing the bump by directing a laser beam toward the semiconductor die. The laser beam may volatize the flux and make an electrical connection between the bump and the circuit pattern. A jig plate may be placed on the semiconductor die the laser beam is directed toward the semiconductor die. The jig plate may have an area that is approximately equal to that of the semiconductor die. Warpage may be reduced during heating or cooling of the semiconductor die by applying pressure to the jig plate. Jig bars may extend outward from the jig plate and may be in contact with the circuit board during the application of pressure to the jig plate. The jig plate may comprise one or more of: silicon, silicon carbide, and glass. The jig plate may have a thickness ranging from 100 to 500 μm. A plurality of bumps on the semiconductor die may be reflowed utilizing the laser beam. A plurality of bumps on the semiconductor die may be reflowed one at a time by directing the laser beam sequentially on individual bumps. The laser beam may be generated by a continuous-wave laser or a pulsed laser. The laser beam may have an energy ranging from 0.1 kW to 2 kW. The laser beam may be light in a 600 to 1000 nanometer wavelength. The semiconductor die may have a thickness ranging from 10 to 1000 μm. A plurality of bumps may be formed on the semiconductor die with a pitch ranging from 10 to 200 μm. The laser beam may heat the semiconductor die near the bump to a temperature in a range of 200 to 350 degrees C. The laser beam may heat a portion of the circuit board proximate to a bottom surface of the semiconductor die to a temperature in a range of 150 to 200 degrees C. while other regions of the circuit board are at temperatures lower than 100 degrees C.

Various aspects of the present disclosure may be embodied in many different forms and should not be construed as being limited to the example embodiments set forth herein. Rather, these example embodiments of the disclosure are provided so that this disclosure will be thorough and complete and will convey various aspects of the disclosure to those skilled in the art. The following discussion presents various aspects of the present disclosure by providing various examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

In the drawings, the thickness of layers and regions are exaggerated for clarity. Here, like reference numerals refer to like elements throughout. As used herein, the term "and/or" includes any and all combinations of one or more of the associated listed items. For example, the phrase "A and/or B" should be understood to mean just A, or just B, or both A and B. Similarly, the phrase "A, B, and/or C" should be understood to mean just A, just B, just C, A and B, A and C, B and C, or all of A and B and C. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprises," "comprising," "includes," and/or "including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

FIGS. 1A to 1D are schematic views of a laser assisted bonding method for semiconductor die interconnection according to an example embodiment of the present disclosure, illustrating intermediate process steps on a unit basis.

As illustrated in FIGS. 1A to 1D, the laser assisted bonding method for semiconductor die interconnection according to the present disclosure includes providing a semiconductor die 110 and a circuit board 120, aligning the semiconductor die 110 on the circuit board 120 and emitting laser beams.

As illustrated in FIG. 1A, the semiconductor die 110 may comprise a plurality of bumps 111 formed on its bottom surface and the circuit board 120 may comprise a plurality of circuit patterns 121 formed on its top surface. The bumps 111 may comprise solder bumps or copper pillars having solder caps formed at bottom ends thereof, but the present disclosure does not limit the types or shapes of the bumps 111 to those illustrated herein.

The semiconductor die 110 may, for example, have a thickness ranging from approximately 10 μm to approximately 1000 μm. If the thickness of the semiconductor die 110 is smaller than approximately 10 μm, internal electronic circuits may be vulnerable to damage by the laser beams. If the thickness of the semiconductor die 110 is greater than approximately 1000 μm, the output energy of the laser beams may be increased and the thickness of the semiconductor device including the semiconductor die 110 may increase, which are generally not desirable.

In addition, the bumps 111 may be formed on the semiconductor die 110 at a pitch ranging from approximately 10 μm to approximately 200 μm, but aspects of the present disclosure are not limited thereto.

Figure 1B:
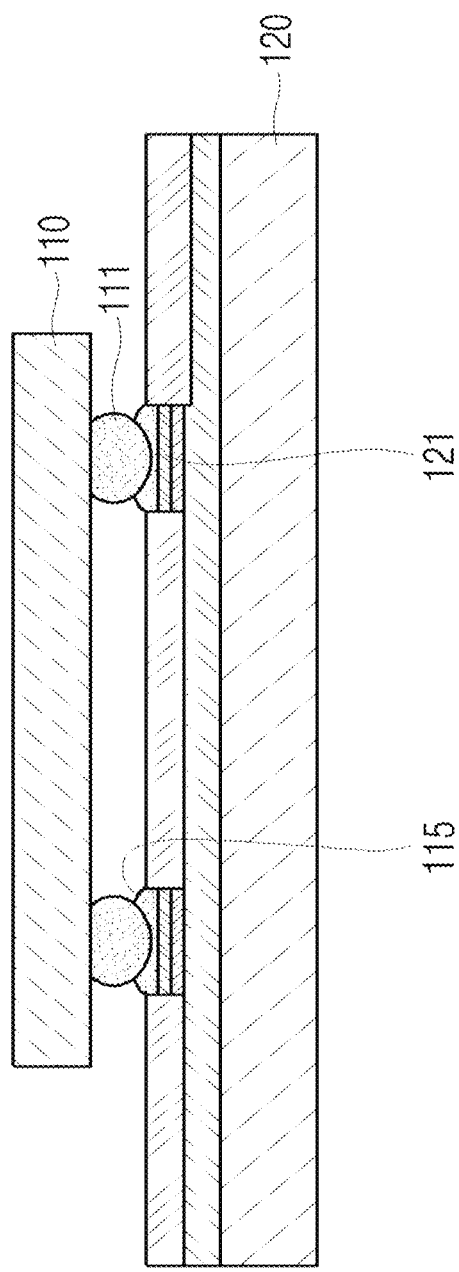

As illustrated in FIG. 1B, flux 115 (e.g., volatile flux) may be applied (e.g., by jetting) to the circuit patterns 121 of the circuit board 120 and the bumps 111 of the semiconductor die 110 may be positioned and/or aligned on the flux 115. The aligning of the semiconductor die 110 on the circuit board 120 may be implemented by a general die attach device, but aspects of the present disclosure are not limited thereto.

Figure 1C:
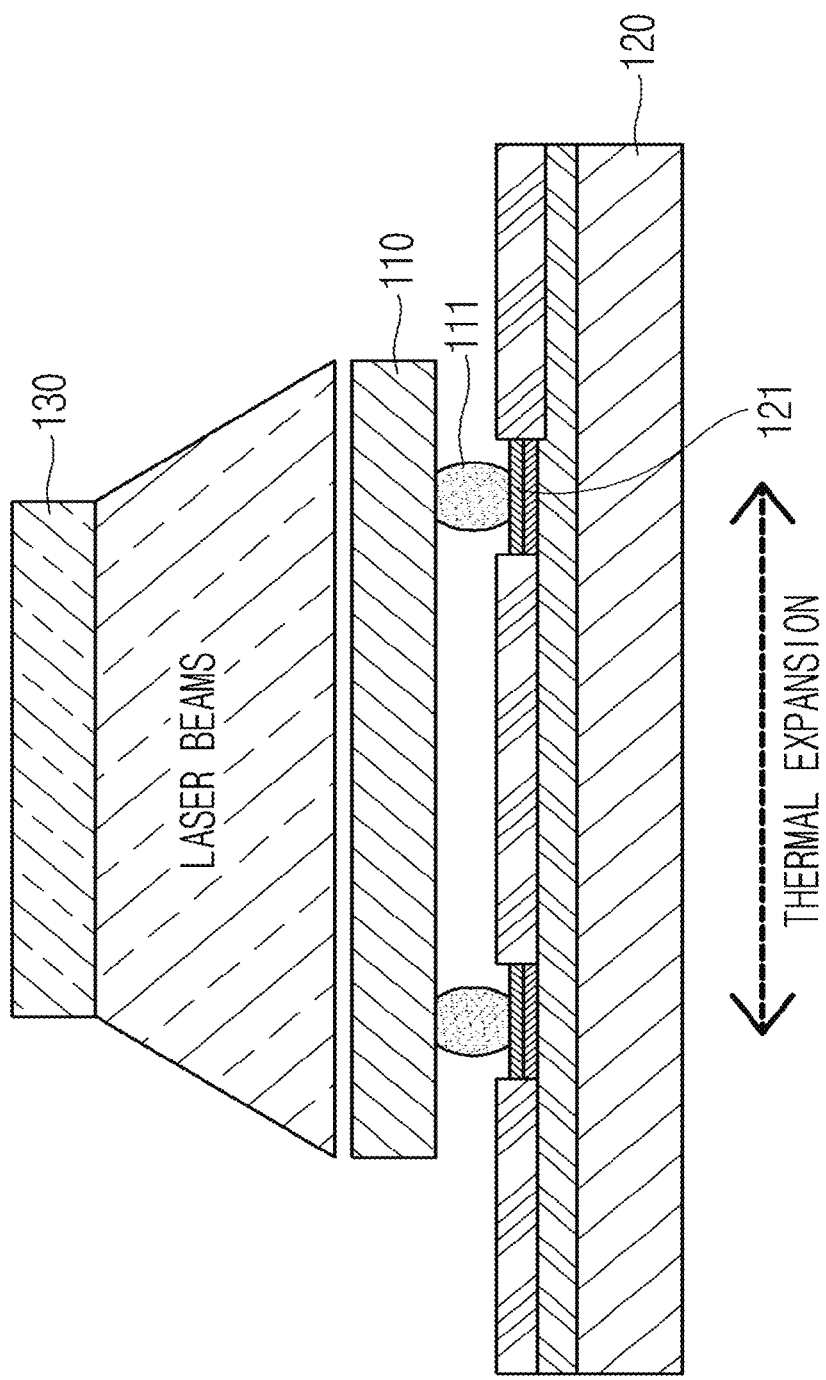

As illustrated in FIG. 1C, one or more laser beams may be emitted from a laser emission system 130 to the semiconductor die 110 to volatilize the flux 115 for removal and to reflow the bumps 111 to then be electrically connected to the circuit board 120. As a result of the laser beam(s) emitted by the laser emission system 130, the semiconductor die 110 may be heated and heat from the heated semiconductor die 110 may be transferred to the bumps 111. Ultimately, the bumps 111 may be melted and the flux 115 volatilized for removal. The melted bumps 111 are therefore electrically connected to the circuit patterns 121 of the circuit board 120.

The laser beams may, for example, have energy ranging from approximately 0.1 kW to approximately 2 kW. If the energy of the laser beams is smaller than approximately 0.1 kW, the bumps 111 might not be melted so that a reflow process is not performed. If the energy of the laser beams is greater than approximately 2 kW, the electronic circuits provided in the semiconductor die 110 and the circuit patterns 121 of the circuit board 120 may be damaged due to the laser beams.

The laser beams may be from pulse lasers or continuous-wave lasers, but aspects of the present disclosure are not limited thereto. In addition, the laser emission system 130 may, for example, operate in either of an air cooling configuration and a water cooling configuration.

When the one or more laser beams are emitted, the semiconductor die may, for example, have a temperature ranging from approximately 150° C. to approximately 400° C., or from approximately 200° C. to approximately 350° C. If the temperature of the semiconductor die is lower than approximately 150° C., the reflow process might not be performed, and if the temperature of the semiconductor die is higher than 400° C., internal electronic circuits provided in the semiconductor die may be damaged.

The laser beams may, for example, have a wavelength ranging from approximately 600 nm to approximately 1100 nm, or from approximately 760 nm to approximately 1500 nm, although wavelengths may extend up to 1000 μm. Thus, the wavelength of the laser beams may, for example, be in the range of infrared radiation. If the wavelength of the laser beams is smaller than approximately 600 nm, the laser beams may have relatively large energy, so that the electronic circuits provided in the semiconductor die may be damaged. If the wavelength of the laser beams is greater than approximately 1100 nm, the laser beams may have relatively small energy, and the reflow process might not be performed. In an example configuration, a single laser beam may be utilized to reflow all of the conductive bumps of a die to be reflowed. For example, such a single laser beam may be directed to the entire die, to a portion of the entire die, to locations on the die corresponding to individual respective conductive bumps, etc, In another example configuration, a plurality of laser beams may be utilized (e.g., at different respective regions, at a same region, at different respective but partially overlapping regions, at locations of the die corresponding to single respective solder bumps, etc.) to reflow the conductive bumps of a die.

In addition, the shape of laser beams emitted may be circular, elliptical, rectangular, square, or the like. In an example implementation where laser beams are individually emitted to each of the bumps 111, circular laser beams may be utilized (e.g., corresponding to circular bumps), elliptical laser beams may be utilized (e.g., corresponding to elliptical bumps), etc. The areas of the laser beams emitted may be equal to or similar to areas of the individual bumps 111. In example instances where laser beams are simultaneously emitted to the plurality of bumps 111, rectangular or square laser beam emitted areas may be utilized where the areas of the emitted laser beams may be equal to or similar to areas of all of the bumps 111, equal to or similar to the area of the die 110, etc. The laser beam(s) utilized to convey energy to the bumps 111 may, for example, be focused to maximize the energy transfer to the die 110 (e.g., to a top surface of the die 110) and ultimately to the bumps 111.

As described above, according to the present disclosure, since the laser beams may be locally emitted or directed to a specific region corresponding to the semiconductor die 110, rather than being globally applied to the entire region of the circuit board 120, the thermal expansion during the reflow process occurs to the circuit board 120 in a smaller extent than in the conventional bonding method.

Figure 1D:
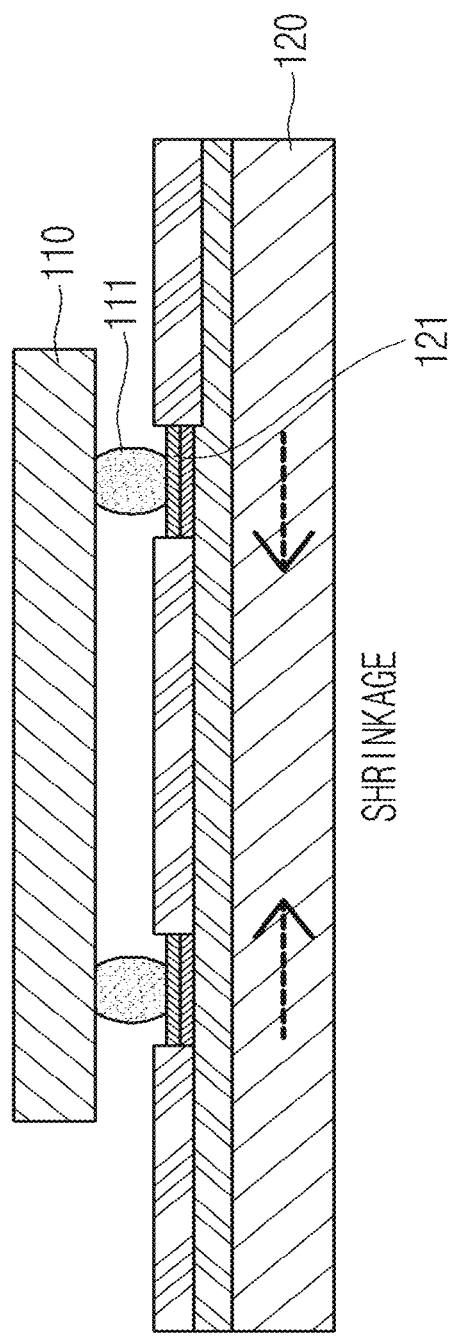

As illustrated in FIG. 1D, after the reflow process, cooling may be performed. At this stage, the bumps 111 may be hardened, and the semiconductor die 110 and the circuit board 120 may be completely electrically connected. In addition, during the cooling, thermal expansion using the laser beams may be minimized, so that shrinkage may also be minimized.

Therefore, in the present disclosure, the semiconductor die 110 and the circuit board 120 may be interconnected by local laser emission, thereby minimizing thermal expansion and shrinkage of the circuit board 120 and ultimately improving the reliability in electrical connection between the semiconductor die 110 and the circuit board 120.

In addition, since the laser emission system may, for example, have a length ranging from approximately 2 m to approximately 3 m, a space required for bonding the semiconductor die 110 and the circuit board 120 may be considerably reduced, compared to the reflow device used in the conventional bonding method, thereby improving space utilization efficiency.

Figure 2A:
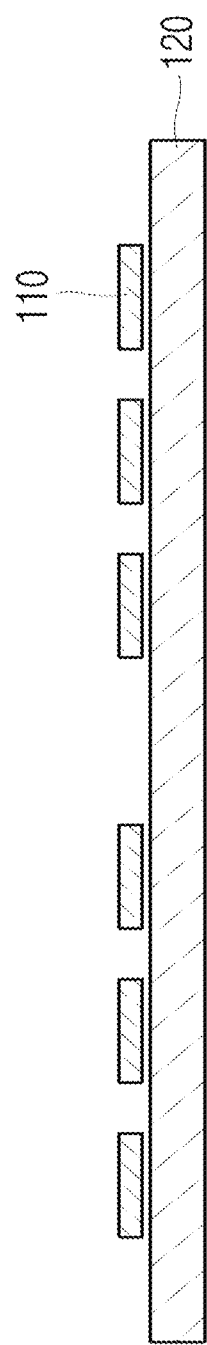
FIGS. 2A and 2B are schematic views of the laser assisted bonding method for semiconductor die interconnection according to an example embodiment of the present disclosure, illustrating intermediate process steps on a strip basis.
Figure 2B:
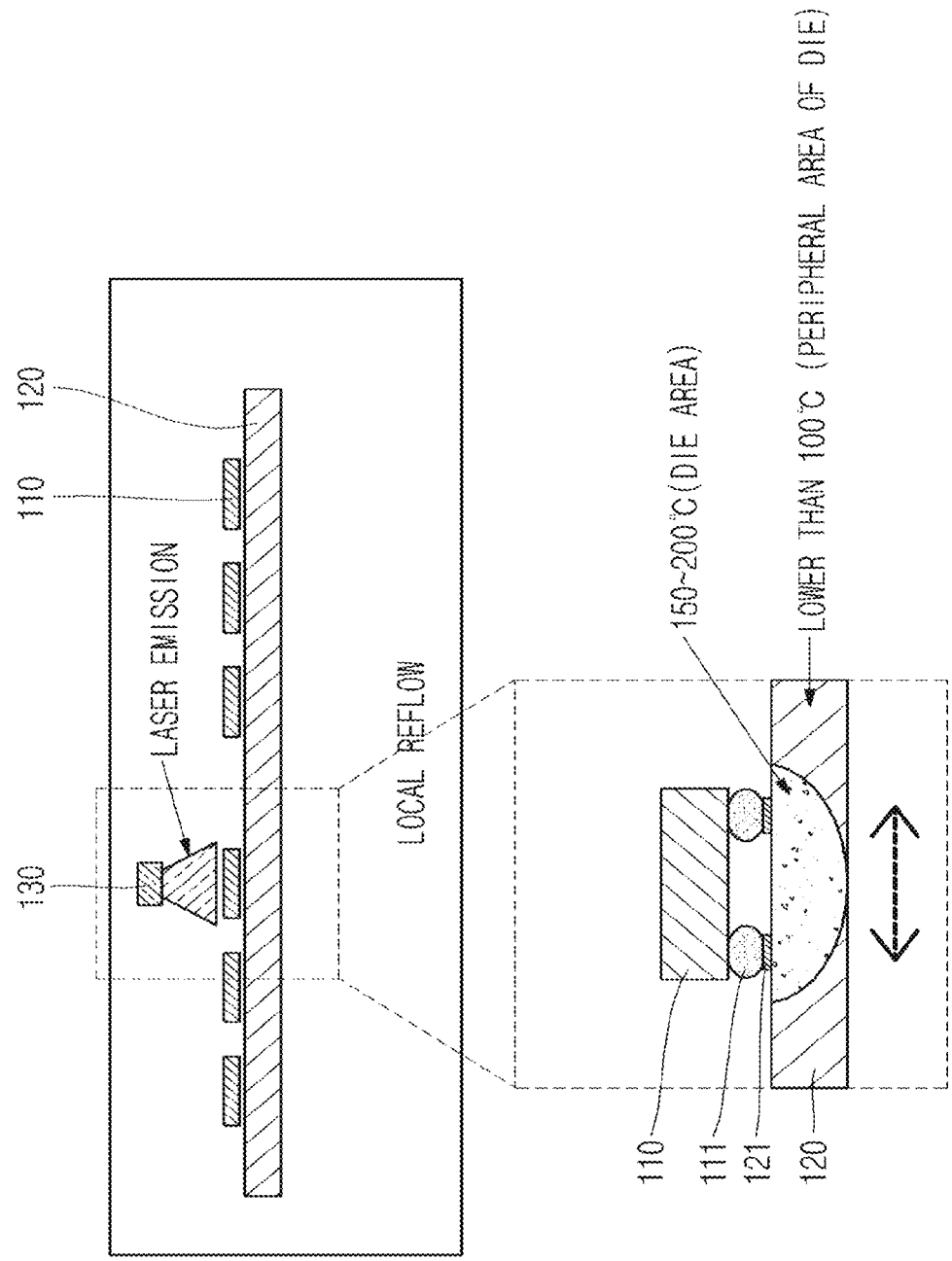

FIGS. 2A and 2B are schematic views of the laser assisted bonding method for semiconductor die interconnection according to an example embodiment of the present disclosure, illustrating intermediate process steps on a strip basis.

As illustrated in FIG. 2A, the circuit board 120 may be strip-shaped comprising multiple units, and a plurality of semiconductor dies 110 may be aligned on the strip-shaped circuit board 120 at a predetermined interval.

As illustrated in FIG. 2B, the laser emission system 130 may be positioned over each of the semiconductor die 110, and laser beams emitted to the individual semiconductor die 110. In an example scenario, a reflow process may be locally performed on the semiconductor dies 110. Here, it is assumed that a plane corresponding to a laser beam emitted area is roughly rectangular. Note, however, as explained previously, a plurality of laser beams may be directed to a single die (e.g., at locations of the die corresponding to respective groups of bumps and/or individual respective bumps).

When the laser beams are emitted, a region of the circuit board 120 proximate to, or corresponding to, bottom portions of the semiconductor dies 110, may have a temperature ranging from approximately 150° C. to approximately 200° C., while the other region of the circuit board 120, not corresponding to the bottom portions of the semiconductor dies 110, may have a temperature ranging from 10° C. to approximately 100° C. For example, a region of the circuit board 120 within 5% of the die length (or 1% or 10%) of the footprint of the die may have a temperature ranging from approximately 150° C. to approximately 200° C., while another region of the circuit board 120 outside of 5% of the die length (or 10% or 20% or 50%) of the footprint of the die may have a temperature ranging from 10° C. to approximately 100° C.

Since the heat energy derived from the laser beams may be transferred only to a local region of the circuit board 120, corresponding to the semiconductor dies 110, thermal expansion and/or shrinkage occurring to the entire region of the circuit board 120 can be minimized, unlike in the conventional bonding method.

While the circuit board 120 may be fixedly positioned, the laser emission system 130 may be moved horizontally and the laser beams may be emitted to the individual semiconductor dies 110. Alternatively, while the laser emission system 130 may be fixedly positioned, the circuit board 120 may be moved horizontally and the laser beams may be emitted to the individual semiconductor dies 110. Further, the circuit board 120 may be moved horizontally and the laser emission system 130 may also be horizontally moved, that is, the circuit board 120 and the laser emission system 130 are moved relative to each other, and the laser beams may be emitted to the individual semiconductor dies 110. Also for example, each of a plurality of die (e.g., some or all die on a strip or wafer) may have a respective laser emission system 130).

Figure 3A:
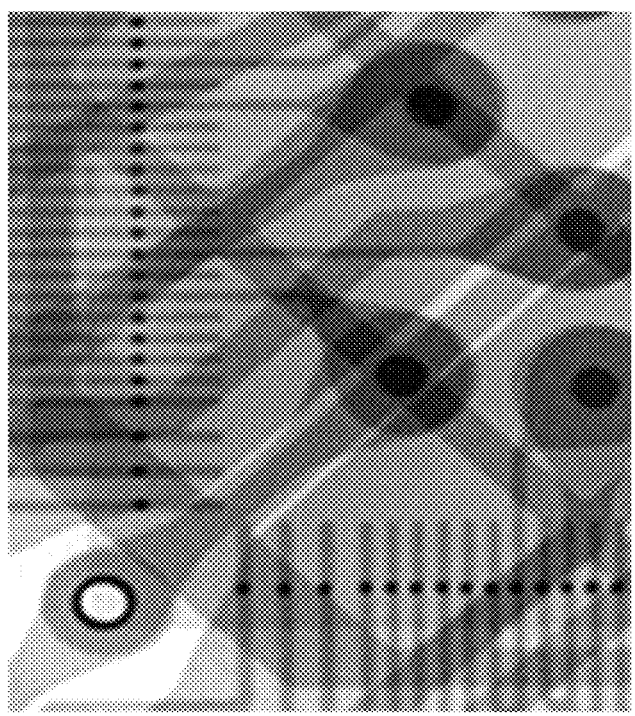
FIGS. 3A and 3B are an X-ray perspective view and a cross-sectional view illustrating interconnected states in the laser assisted bonding method for semiconductor die interconnection according to an example embodiment of the present disclosure.
Figure 3B:
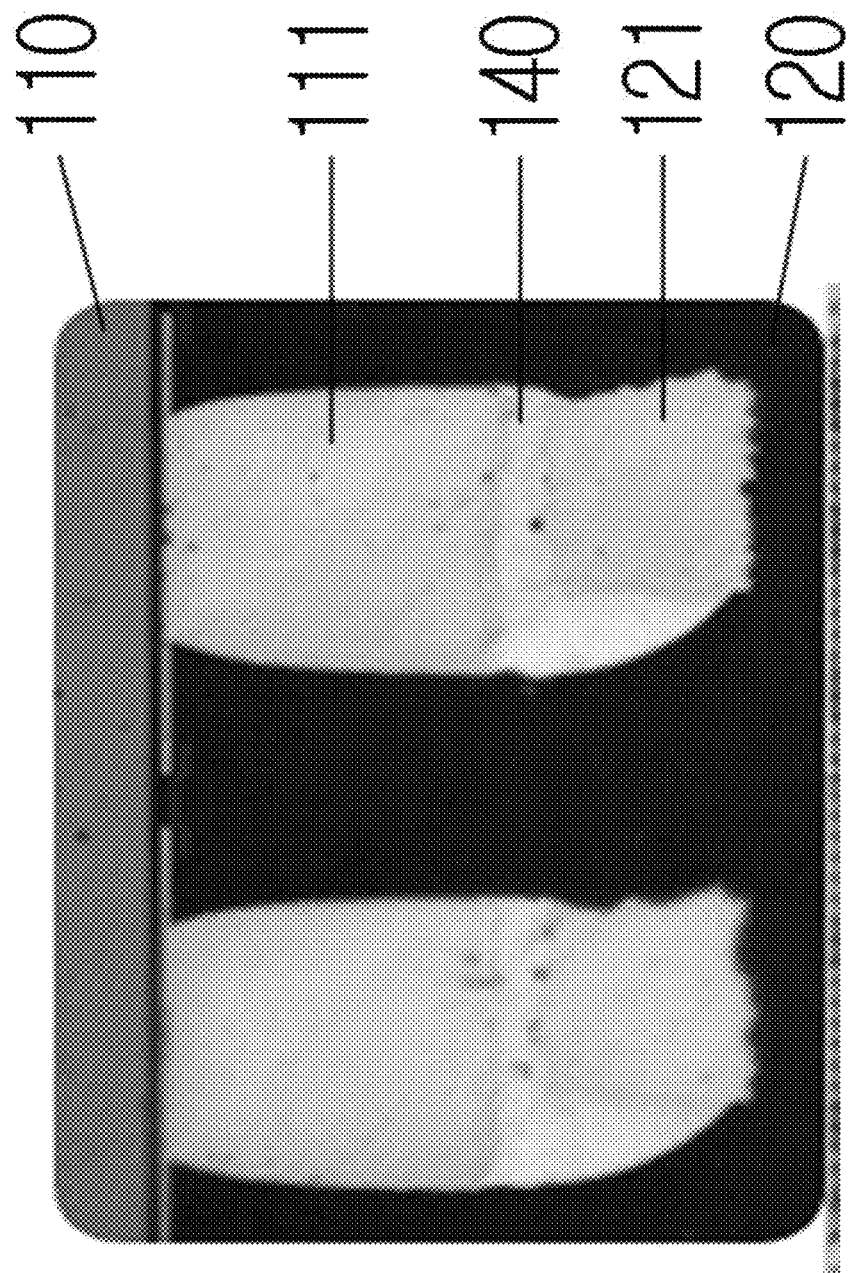

FIGS. 3A and 3B are an X-ray perspective view and a cross-sectional view illustrating interconnected states in the laser assisted bonding method for semiconductor die interconnection according to an embodiment of the present disclosure.

As illustrated in FIGS. 3A and 3B, bumps 111, such as copper pillars, may be formed on the semiconductor die 110 and circuit patterns 121 may be formed on the circuit board 120. The bumps 111 and the circuit patterns 121 may be interconnected by a solder 140 melted and cooled utilizing the laser assisted bonding method according to an example embodiment of the present disclosure.

In an example scenario, the solder 140 may be melted and cooled by the laser assisted bonding method, thereby electrically connecting the semiconductor die 110 and the circuit board 120 using the solder 140.

Figure 4A:
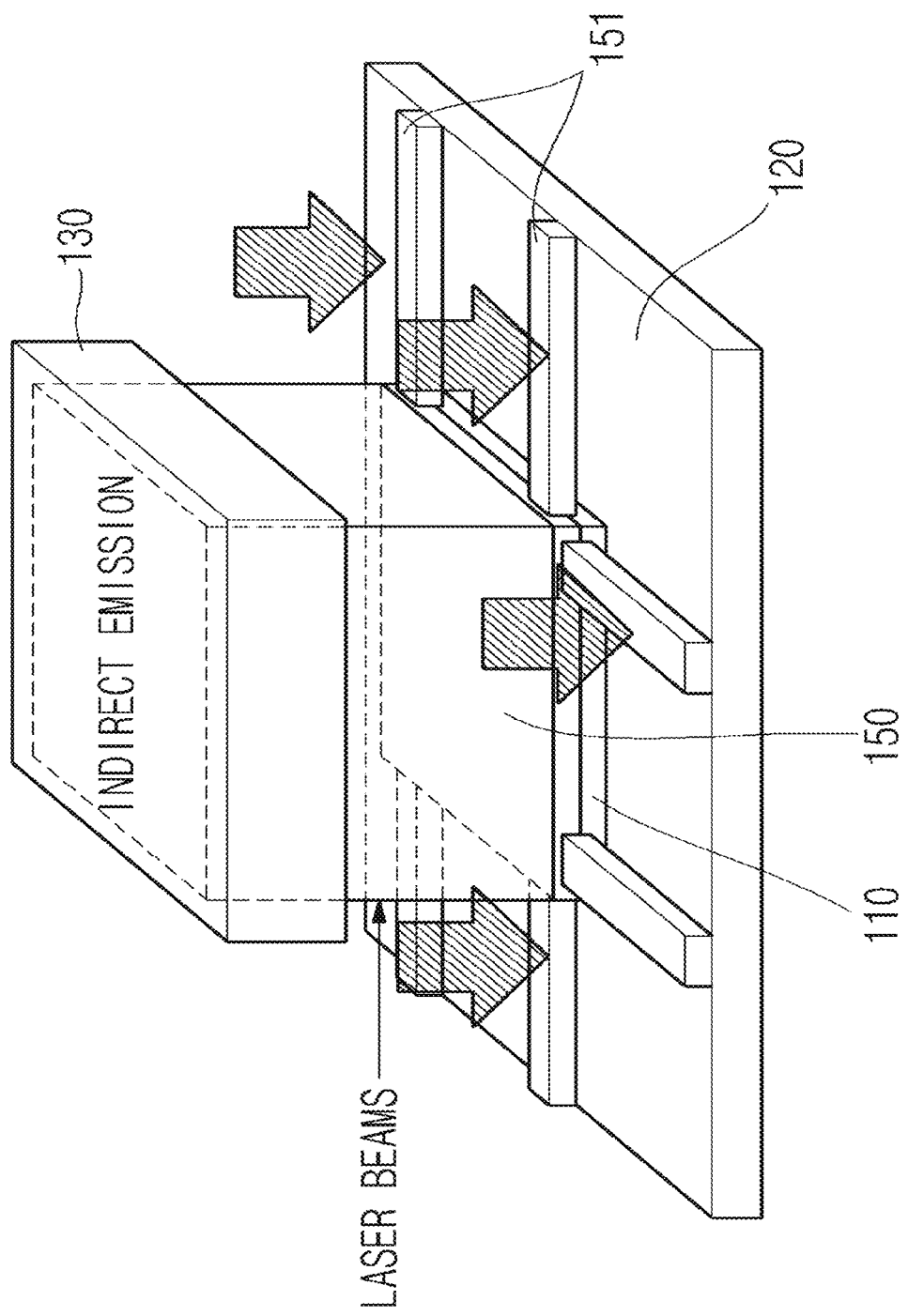
FIGS. 4A and 4B are schematic views illustrating an indirect laser assisted bonding method and a direct laser assisted bonding method for semiconductor die interconnection according to another example embodiment of the present disclosure.
Figure 4B:
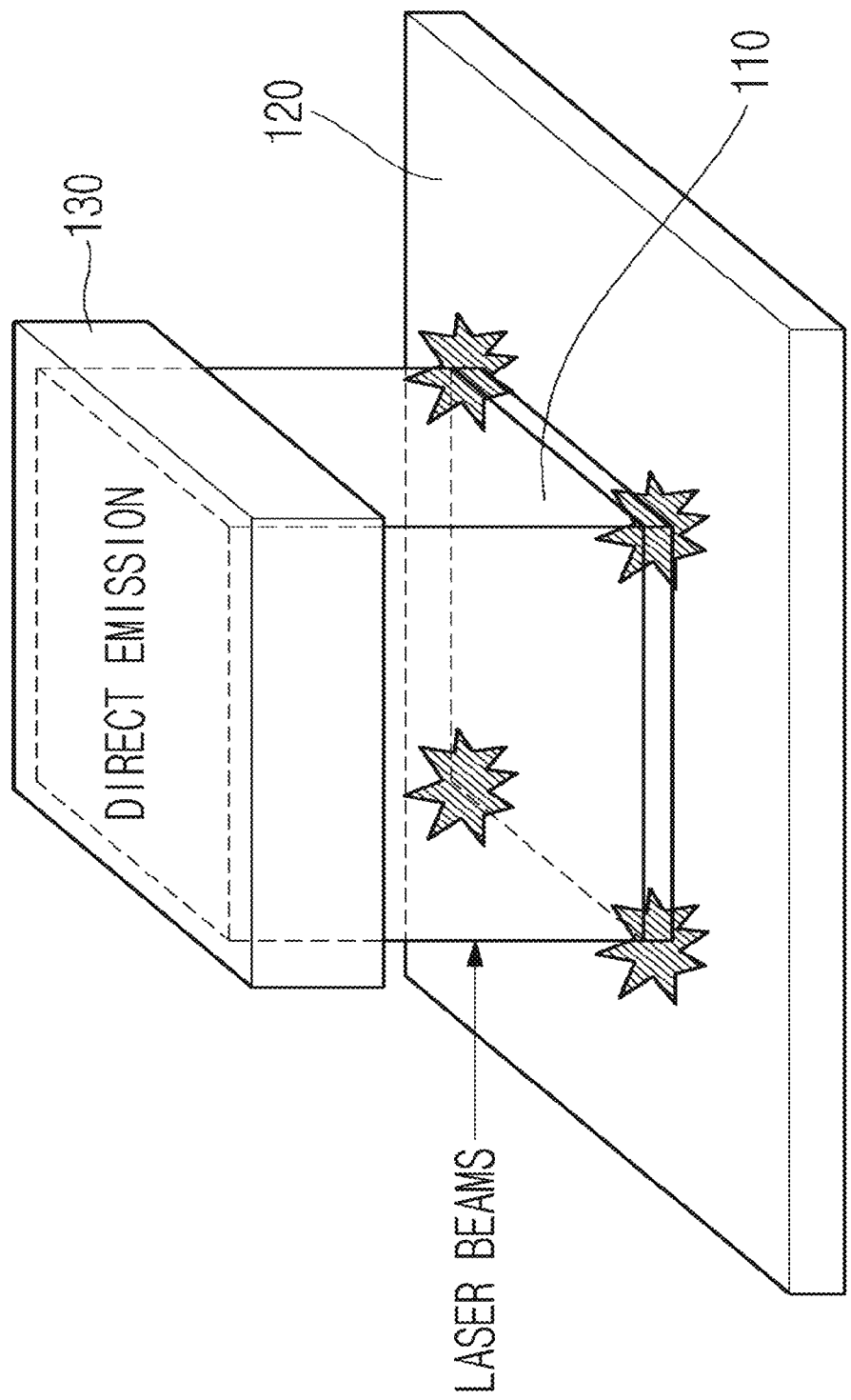

FIGS. 4A and 4B are schematic views illustrating an indirect laser assisted bonding method and a direct laser assisted bonding method for semiconductor die interconnection according to another example embodiment of the present disclosure.

As illustrated in FIG. 4A, when laser beams are emitted, a jig plate 150 having an area corresponding to a top surface of a semiconductor die 110 may further be positioned on the semiconductor die 110. The jig plate 150 may have a thickness ranging from approximately 100 μm to approximately 500 μm, but the present disclosure does not limit the thickness of the jig plate 150 to that listed herein.

In order to increase a pressure applied to the semiconductor die 110 without increasing the thickness of the jig plate 150, a plurality of jig bars 151 outwardly extending and mounted on the circuit board 120 may further be formed along the periphery of the jig plate 150, such that the plurality of jig bars 151 extend outwardly a predetermined length from sides of the rectangular jig plate 150 and may be positioned on the circuit board 120.

Here, the jig plate 150 may comprise one or more materials comprising silicon, silicon carbide, and glass, but not limited thereto.

As described above, in the laser assisted bonding method according to another example embodiment of the present disclosure, warpage of the semiconductor die 110, which may occur when the semiconductor die 110 is relatively thin, may be avoided using the pressure applied to the jig plate 150.

In addition, according to an example embodiment of the present disclosure, in which the jig plate 150 is employed, the jig plate 150 may be first heated by the laser beams and heat derived from the heated jig plate 150 may be transferred to the semiconductor die 110 (indirect emission). For example, one or more laser beams of the laser emission system 130 may be focused to maximize the amount of heat energy transferred to the jig plate 150. Therefore, a probability of causing damage to electronic circuits provided in the semiconductor die 110 due to direct emission of laser beams may be reduced. FIG. 4B illustrates a direct laser assisted bonding method, in which there is a risk that the electronic circuits provided in the semiconductor die 110 may be liable to be damaged due to the laser beams.

This disclosure provides a laser assisted bonding method for a semiconductor die interconnection according to various exemplary embodiments of the present disclosure. The scope of the present disclosure is not limited by these exemplary embodiments. Numerous variations, whether explicitly provided for by the specification or implied by the specification, such as variations in structure, dimension, type of material and manufacturing process, may be implemented by one skilled in the art in view of this disclosure.

The present disclosure provides a laser assisted bonding method for semiconductor die interconnection, which can minimize thermal expansion and thermal shrinkage of a circuit board by interconnecting a semiconductor die and the circuit board by local laser emission, thereby improving the reliability in electrical connection between the semiconductor die and the circuit board.

The present disclosure also provides a laser assisted bonding method for semiconductor die interconnection, which can minimize a bonding space using a laser emission system for locally emitting laser beams, thereby improving space utilization efficiency.

According to various aspects of the present disclosure, there is provided a laser assisted bonding method that includes providing a semiconductor die having bumps and a circuit board having circuit patterns, applying (e.g., jetting) flux to the circuit patterns of the circuit board and positioning the bumps of the semiconductor die on the flux, and emitting laser beams to the semiconductor die to volatilize the flux for removal and reflowing the bumps to be electrically connected to the circuit board.

The laser beams may, for example, have energy ranging from 0.1 kW to 2 kW. The laser beams may, for example, be pulse lasers or continuous waver lasers. The semiconductor die may, for example, have a thickness ranging from 10 μm to 1000 μm. The bumps may, for example, be formed on the semiconductor die at a pitch ranging from 10 μm to 200 μm. When the laser beams are emitted, a region of the circuit board, for example corresponding generally or exactly to a bottom portion of the semiconductor die (e.g., within 1%, 5%, or 10% of the die lateral width), may have a temperature ranging from 150° C. to 200° C., and the other region of the circuit board, for example not corresponding generally or exactly to a bottom portion of the semiconductor die, may have a temperature ranging from 10° C. to 100° C.

When the laser beams are emitted, a jig plate having an area generally or exactly corresponding to a top surface of the semiconductor die (e.g., within 1%, 5%, or 10%) may be positioned on the top surface of the semiconductor die. The jig plate may, for example, have a thickness ranging from 100 μm to 500 μm. The jig plate may, for example, comprise one or more materials selected from silicon, silicon carbide and glass. A plurality of jig bars outwardly extending and mounted on the circuit board may further be formed along the periphery of the jig plate. When the laser beams are emitted, the semiconductor die may have a temperature ranging from 200° C. to 350° C., for example. The laser beams may have a wavelength ranging from 700 nm to 1000 nm, for example, although wavelengths may extend to 1000 μm.

As described above, in the laser assisted bonding method for semiconductor die interconnection according to an embodiment of the present disclosure, thermal expansion and thermal shrinkage of a circuit board can be minimized by interconnecting a semiconductor die and the circuit board by local laser emission, thereby improving the reliability in electrical connection between the semiconductor die and the circuit board.

In addition, according to an embodiment of the present disclosure, a bonding space can be minimized using a laser emission system for locally emitting laser beams, thereby improving space utilization efficiency.

This disclosure provides example embodiments supporting the present disclosure. The scope of the present disclosure is not limited by these example embodiments. Numerous variations, whether explicitly provided for by the specification or implied by the specification, such as variations in structure, dimension, type of material and manufacturing process, may be implemented by one skilled in the art in view of this disclosure.

While various aspects of the present disclosure have been described with reference to certain supporting embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for manufacturing a semiconductor device, the method comprising:
   forming flux on a circuit pattern on a circuit board;
   placing a semiconductor die on the circuit board where a bump on the semiconductor die contacts the flux;
   placing a jig plate on the semiconductor die;
   reflowing the bump by heating the jig plate with a laser beam directed toward the jig plate, transferring heat from the jig plate to the bump via the semiconductor die, volatizing the flux, and making an electrical connection between the bump and the circuit pattern;
   removing the jig plate from the semiconductor die; and
   reducing warpage during heating or cooling of the semiconductor die by applying pressure to the jig plate;
   wherein jig bars extend outward from the jig plate and are in contact with the circuit board during said applying pressure to the jig plate.

2. The method according to claim 1, wherein the jig plate has an area within 10 percent to that of the semiconductor die.

3. The method according to claim 1, wherein the jig plate comprises one or more of: silicon, silicon carbide, and glass.

4. The method according to claim 1, wherein the jig plate has a thickness ranging from 100 to 500 µm.

5. The method according to claim 1, comprising reflowing a plurality of bumps on said semiconductor die utilizing the laser beam.

6. The method according to claim 1, comprising reflowing a plurality of bumps on said semiconductor die one at a time by directing the laser beam sequentially on areas of the jig plate that correspond to individual bumps of the plurality of bumps.

7. The method according to claim 1, comprising generating the laser beam with a continuous-wave laser.

8. The method according to claim 1, comprising generating the laser beam with a pulsed laser.

9. The method according to claim 1, wherein the laser beam has an energy ranging from 0.1 kW to 2 kW.

10. The method according to claim 1, wherein the laser beam comprises light in a 600 to 1000 nanometer wavelength.

11. The method according to claim 1, wherein the semiconductor die has a thickness ranging from 10 µm to 1000 µm.

12. The method according to claim 1, wherein a plurality of bumps are formed on the semiconductor die with a pitch ranging from 10 µm to 200 µm.

13. The method according to claim 1, wherein said heating the jig plate with the laser beam causes the jig plate to heat the semiconductor die near the bump to a temperature in a range of 200 to 350 degrees C.

14. The method according to claim 1, wherein said heating the jig plate with the laser beam causes the jig plate to heat a portion of the circuit board proximate to a bottom surface of the semiconductor die to a temperature in a range of 150 to 200 degrees C. while other regions of the circuit board are at temperatures lower than 100 degrees C.

15. A method for forming a semiconductor device, the method comprising:

forming flux on a circuit pattern on a circuit board;

placing a semiconductor die on the circuit board where bumps on the semiconductor die contact the flux at a plurality of locations on the circuit pattern;

reflowing the bumps by directing an infrared laser beam at the semiconductor die, volatizing the flux and making electrical connections between the bumps and the circuit pattern;

placing a jig plate on the semiconductor die when directing the infrared laser beam at the semiconductor die; and reducing warpage during heating or cooling of the semiconductor die by applying pressure to the jig plate;

wherein jig bars extend outward from the jig plate and are in contact with the circuit board during said applying pressure to the jig plate.

16. A method for manufacturing a semiconductor device, the method comprising:

forming flux on a circuit pattern of a circuit board panel;

placing a first semiconductor die on the circuit board panel, where a first bump on the first semiconductor die contacts the flux;

placing a second semiconductor die on the circuit board panel, where a second bump on the second semiconductor die contacts the flux;

placing a jig plate on the first semiconductor die;

reflowing the first bump by, at least in part, heating the jig plate on the first semiconductor device with a laser beam and transferring heat from the jig plate to the first bump via the first semiconductor die;

placing the jig plate on the second semiconductor die; and after said reflowing the first bump, reflowing the second bump by, at least in part, heating the jig plate on the second semiconductor device with a laser beam and transferring heat from the jig plate to the second bump via the second semiconductor die, wherein jig bars extend outward from the jig plate and are in contact with the circuit board during said applying pressure to the jig plate.

17. The method according to claim 16, comprising reducing warpage during heating or cooling of the first semiconductor die by applying pressure to the jig plate.

* * * * *